(12) United States Patent
Nakamura et al.

(10) Patent No.: US 8,232,185 B2
(45) Date of Patent: Jul. 31, 2012

(54) METHOD FOR MANUFACTURING SEMICONDUCTOR CHIP, ADHESIVE FILM FOR SEMICONDUCTOR, AND COMPOSITE SHEET USING THE FILM

(75) Inventors: Yuuki Nakamura, Hitachi (JP); Tsutomu Kitakatsu, Hitachi (JP); Youji Katayama, Hitachi (JP); Keiichi Hatakeyama, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/594,634

(22) PCT Filed: Mar. 31, 2008

(86) PCT No.: PCT/JP2008/056361
§ 371 (c)(1),
(2), (4) Date: Dec. 11, 2009

(87) PCT Pub. No.: WO2008/126718
PCT Pub. Date: Oct. 23, 2008

(65) Prior Publication Data
US 2010/0120229 A1    May 13, 2010

(30) Foreign Application Priority Data

Apr. 5, 2007 (JP) ................................ P2007-099344
Aug. 6, 2007 (JP) ................................ P2007-204338

(51) Int. Cl.
*H01L 21/44* (2006.01)
*H01L 21/48* (2006.01)
*H01L 21/50* (2006.01)
*H01L 21/46* (2006.01)
*H01L 21/78* (2006.01)

(52) U.S. Cl. ......... 438/464; 438/118; 438/119; 438/462

(58) Field of Classification Search .................. 438/464, 438/118, 119, 113, 114, 458, 459, 110, 462, 438/112, 124, 127
See application file for complete search history.

(56) References Cited

FOREIGN PATENT DOCUMENTS

| CN | 1799126 A | 7/2006 |
|----|-----------|--------|
| JP | 2002-192370 | 7/2002 |
| JP | 2003-338467 | 11/2003 |

(Continued)

OTHER PUBLICATIONS

Office Action dated Aug. 6, 2010, Patent Application No. 2008-80010712.4, 5 Pages, Chinese Patent Office, The People's Republic of China.
English translation of the International Preliminary Report on Patentability dated Oct. 22, 2009, for Application No. PCT/JP2008/056361, filed Mar. 31, 2008.

(Continued)

*Primary Examiner* — Chuong A. Luu
(74) *Attorney, Agent, or Firm* — Antonelli, Terry, Stout & Kraus, LLP.

(57) ABSTRACT

There is provided a method that allows semiconductor chips to be obtained from a semiconductor wafer at high yield, while sufficiently inhibiting generation of chip cracks and burrs. The method for manufacturing a semiconductor chip comprises a step of preparing a laminated body having a semiconductor wafer, an adhesive film for a semiconductor and dicing tape laminated in that order, the semiconductor wafer being partitioned into multiple semiconductor chips and notches being formed from the semiconductor wafer side so that at least a portion of the adhesive film for a semiconductor remains uncut in its thickness direction, and a step of stretching out the dicing tape in a direction so that the multiple semiconductor chips are separated apart, to separate the adhesive film for a semiconductor along the notches. The adhesive film for a semiconductor has a tensile breaking elongation of less than 5% and the tensile breaking elongation of less than 110% of the elongation at maximum load.

7 Claims, 14 Drawing Sheets

FOREIGN PATENT DOCUMENTS

| | | |
|---|---|---|
| JP | 2006-203133 | 8/2006 |
| JP | 2007-335643 | 12/2007 |
| KR | 10-2006-0021337 | 3/2006 |
| KR | 10-2006-0114401 | 11/2006 |
| WO | WO 2004/109786 A1 | 12/2004 |

OTHER PUBLICATIONS

Official Action dated Apr. 20, 2011, Patent application No. 10-2009-7017859; 5 pages; Korean Patent Office; Republic of Korea.

Notice of Allowance mailed Mar. 29, 2012, for Korean Patent Application No. 10-2009-7017859; 2 pages; Korean Patent Office; Republic of Korea.

(a)

(b)

METHOD FOR MANUFACTURING SEMICONDUCTOR CHIP, ADHESIVE FILM FOR SEMICONDUCTOR, AND COMPOSITE SHEET USING THE FILM

TECHNICAL FIELD

The present invention relates to a method for manufacturing a semiconductor chip, and to an adhesive film for a semiconductor and a composite sheet using the film.

BACKGROUND ART

When a semiconductor chip is mounted on a supporting member, silver paste is conventionally used, for the most part, as the die bonding material to bond the semiconductor chip with the supporting member. However, as semiconductor chips become smaller with higher performance and the supporting members used also become smaller and more miniaturized, methods that employ silver pastes are presenting problems including paste bleed-out and wire bonding troubles due to sloping of the semiconductor chip. In recent years, therefore, adhesive films (adhesive films for semiconductors) have come to be used in place of silver pastes.

Systems used to obtain semiconductor devices using adhesive films include short bar attachment systems and wafer back-side attachment systems.

In a short bar attachment system, short bars are cut out by cutting or punching from a reel-shaped adhesive film and the short bars of the adhesive film are bonded to a supporting member. Individuated semiconductor chips are joined to the supporting member by a separate dicing step, via the adhesive film bonded to the supporting member. A semiconductor device is then obtained, if necessary by a wire bond step, sealing step, or the like. In short bar attachment systems, however, a special assembly apparatus is necessary to cut out the adhesive film into short bars and bond them to the supporting member, and therefore production cost has been higher than methods using silver paste.

In a wafer back-side attachment system, first an adhesive film and dicing tape are attached in that order to the back side of a semiconductor wafer. The semiconductor wafer is diced for partitioning into a plurality of semiconductor chips, and the adhesive film is cut for each semiconductor chip. Next, the semiconductor chips are picked up together with the adhesive films laminated on their back sides, and the semiconductor chips are bonded to supporting members through the adhesive films. A semiconductor device is then obtained by further steps such as heating, curing and wire bonding. A wafer back-side attachment system does not require an assembly apparatus for individuation of the adhesive film, and a conventional assembly apparatus used for silver paste may be used either in its original form or with part of the apparatus modified by addition of a heating plate or the like. Among methods that employ adhesive films, therefore, this method has been of interest with the aim of helping to limit production cost.

Methods proposed for dicing semiconductor wafers, on the other hand, include stealth dicing, in which a semiconductor wafer is irradiated with laser light to selectively create reformed sections inside the semiconductor wafer, and the semiconductor wafer is cut along the reformed sections (Patent documents 1 and 2). In this method, dicing tape is stretched to apply stress to the semiconductor wafer, and the semiconductor wafer is partitioned into multiple semiconductor chips along the reformed sections.

[Patent document 1] Japanese Unexamined Patent Publication No. 2002-192370
[Patent document 2] Japanese Unexamined Patent Publication No. 2003-338467

DISCLOSURE OF THE INVENTION

Problems to be Solved by the Invention

Wafer back-side attachment systems require the adhesive film to be cut simultaneously during semiconductor wafer dicing. However, when the semiconductor wafer and adhesive film are simultaneously cut by ordinary dicing methods employing a diamond blade, cracking occurs on the side surfaces of the cut semiconductor chips (chip cracks), and the adhesive film becomes raised on the cut surfaces, producing numerous burrs. The presence of such chip cracks and burrs tends to result in cracking of the semiconductor chips during their pickup, thus lowering the yield.

The stealth dicing method mentioned above can potentially inhibit the extent of chip cracks and burrs produced with dicing. However, it is known that when the semiconductor wafers are partitioned by stretching dicing tape after creating reformed sections in the semiconductor wafers by laser working, it is difficult to completely separate the adhesive film for a semiconductor simply by stretching of the dicing tape, while it is also difficult to obtain high semiconductor chip yields in practice.

It is an object of the present invention to provide a method that allows semiconductor chips to be obtained from a semiconductor wafer at high yield, while sufficiently inhibiting generation of chip cracks and burrs. It is another object of the invention to provide an adhesive film for a semiconductor and composite sheet that can be suitably used in the method.

Means for Solving the Problems

According to one aspect, the invention relates to a method for manufacturing a semiconductor chip. The manufacturing method of the invention comprises a step of preparing a laminated body having a semiconductor wafer, an adhesive film for a semiconductor and dicing tape laminated in that order, the adhesive film for a semiconductor having a tensile breaking elongation of less than 5%, the tensile breaking elongation being less than 110% of the elongation at maximum load, the semiconductor wafer being partitioned into multiple semiconductor chips, and notches being formed from the semiconductor wafer side so that at least a portion of the adhesive film for a semiconductor remains uncut in its thickness direction, and a step of stretching out the dicing tape in a direction so that the multiple semiconductor chips are separated apart, to separate the adhesive film for a semiconductor along the notches.

According to the manufacturing method of the invention, a laminated body is prepared with the adhesive film for a semiconductor connected instead of being completely cut. Stretching out of the dicing tape also causes the adhesive film for a semiconductor to be partitioned. According to this method, the adhesive film for a semiconductor having the aforementioned specified tensile breaking elongation is employed to allow semiconductor chips to be obtained from a semiconductor wafer at high yield while sufficiently inhibiting generation of chip cracks and burrs.

The method for manufacturing a semiconductor chip according to the invention may also comprise a step of preparing a laminated body having a semiconductor wafer, an adhesive film for a semiconductor and dicing tape laminated in that order, the adhesive film for a semiconductor having a tensile breaking elongation of less than 5% and the tensile breaking elongation being less than 110% of the elongation at maximum load, with reformed sections formed in the semiconductor wafer by laser working along lines for division of the semiconductor wafer into multiple semiconductor chips, and a step of stretching out the dicing tape in a direction so that the multiple semiconductor chips are separated apart, to partition the semiconductor wafer into multiple semiconductor chips while partitioning the adhesive film for a semiconductor along the reformed sections.

In the manufacturing method of the invention, the semiconductor wafer is partitioned after forming reformed sections in the semiconductor wafer by laser working, and therefore generation of chip cracks and burrs is satisfactorily prevented compared to conventional methods that employ dicing blades or the like. Furthermore, since the method employs an adhesive film for a semiconductor having the aforementioned specified tensile characteristics, the adhesive film for a semiconductor is efficiently and reliably partitioned by stretching out of the dicing tape, allowing semiconductor chips to be obtained at high yield as a result.

The adhesive film for a semiconductor preferably comprises a thermoplastic resin, a thermosetting component and a filler, and has a filler content of less than 30% by mass with respect to the mass of the adhesive film for a semiconductor. Reducing the filler content somewhat while imparting the specified tensile characteristic to the adhesive film for a semiconductor will inhibit reflow cracks after mounting.

In the manufacturing methods described above, the step of preparing the laminated body preferably includes a step of attaching the adhesive film for a semiconductor onto the semiconductor wafer at a temperature of not higher than 100° C. Attachment of the adhesive film for a semiconductor to the semiconductor wafer while maintaining a relatively low temperature of the adhesive film for a semiconductor will satisfactorily prevent warping of the semiconductor wafer and damage resulting from the thermal history of the dicing tape or backgrind tape.

According to another aspect, the invention relates to an adhesive film for a semiconductor. The adhesive film for a semiconductor according to the invention has a tensile breaking elongation of less than 5% and the tensile breaking elongation of less than 110% of the elongation at maximum load. By employing such an adhesive film for a semiconductor in the manufacturing method of the invention described above, it is possible to obtain semiconductor chips from a semiconductor wafer at high yield while sufficiently inhibiting generation of chip cracks and burrs.

Such an adhesive film for a semiconductor according to the invention is preferably attachable to a semiconductor wafer at 100° C. or below.

The adhesive film for a semiconductor according to the invention preferably comprises a thermoplastic resin, a thermosetting component and a filler, where a filler content is less than 30% by mass with respect to the mass of the adhesive film for a semiconductor. Reducing the filler content somewhat while imparting the specified tensile characteristics to the adhesive film for a semiconductor will further inhibit reflow cracks.

According to yet another aspect, the invention relates to a composite sheet comprising an adhesive film for a semiconductor according to the invention as described above, and dicing tape laminated on one side of the adhesive film for a semiconductor. By using such a composite sheet it is possible to further efficiently obtain a semiconductor chip and semiconductor device by simple steps.

Effect of the Invention

According to the invention it is possible to obtain a high yield of semiconductor chips from a semiconductor wafer while sufficiently inhibiting generation of chip cracks and burrs.

EXPLANATION OF SYMBOLS

1: Semiconductor wafer, 1a: reformed section, 2: adhesive film for a semiconductor, 3: dicing tape, 4: dicing blade, 5: division line, 7: wiring-attached base, 8: bonding wire, 9: sealing resin layer, 10, 10a, 10b: semiconductor chips, 20: laminated body, 40: notch, 100: semiconductor device.

BEST MODE FOR CARRYING OUT THE INVENTION

Preferred embodiments of the invention will now be described in detail. However, the present invention is not limited to the embodiments described below.

(First Embodiment)

Figure 3:
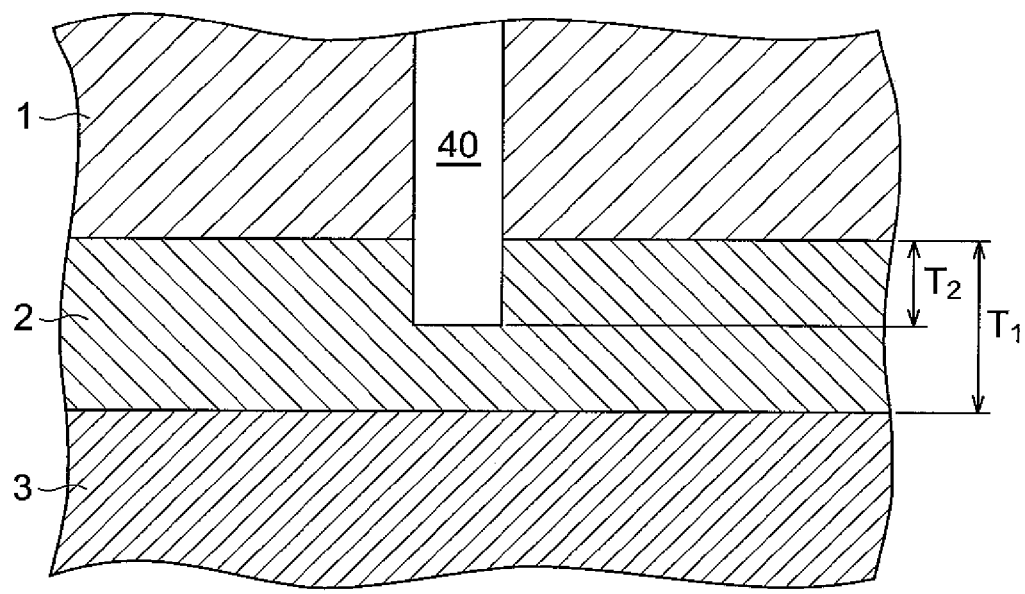
FIG. 3 is an end view showing a method for manufacturing a semiconductor chip according to a first embodiment.
Figure 4:
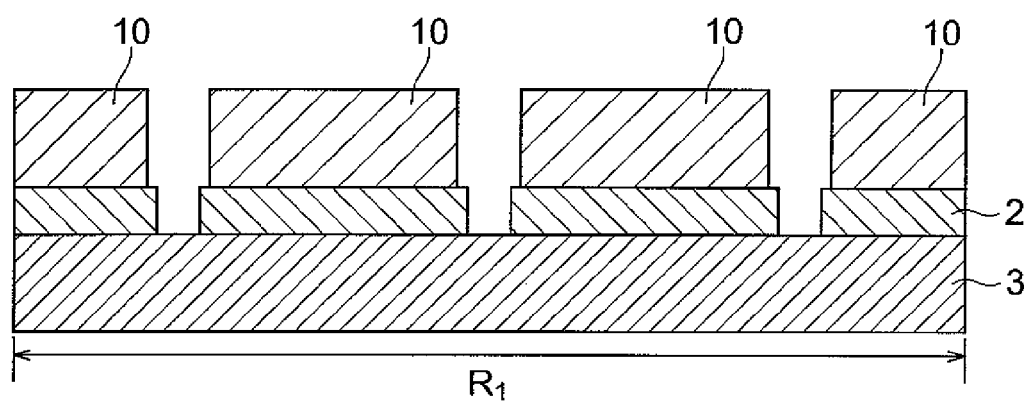
FIG. 4 is an end view showing a method for manufacturing a semiconductor chip according to a first embodiment.
Figure 5:
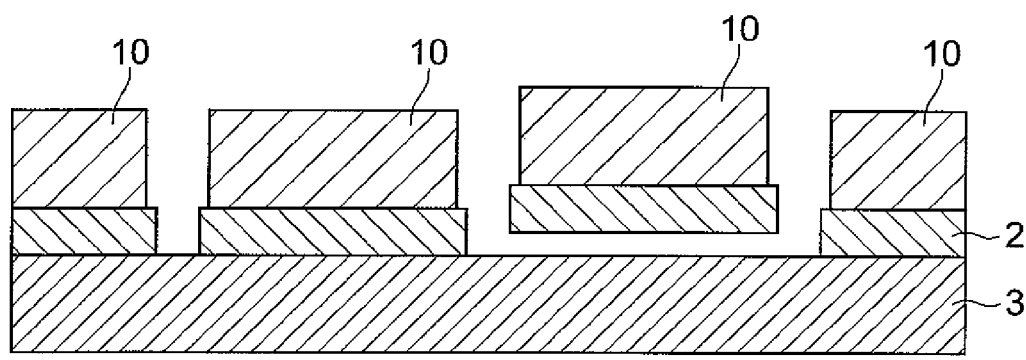
FIG. 5 is an end view showing a method for manufacturing a semiconductor chip according to a first embodiment.
Figure 6:
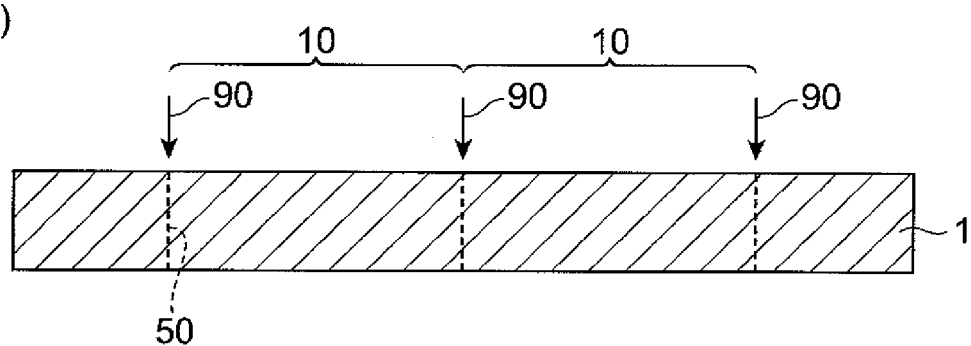
FIG. 6 is an end view showing a method for manufacturing a semiconductor chip according to a second embodiment.
Figure 6:
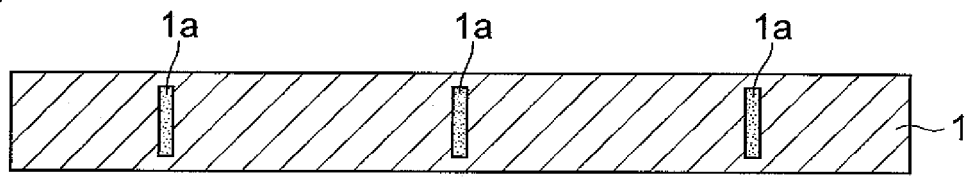

FIGS. 1, 2, 3, 4 and 5 are end views showing a method for manufacturing a semiconductor chip according to a first embodiment. The method for manufacturing a semiconductor chip according to this embodiment comprises a step of preparing a laminated body 20 obtained by laminating a semiconductor wafer 1, an adhesive film for a semiconductor 2 and dicing tape 3 in that order (FIG. 1), a step of forming notches 40 in the laminated body 20 from one side of the semiconductor wafer 1 (FIGS. 2 and 3), a step of partitioning the adhesive film for a semiconductor 2 along the notches 40 (FIG. 4), and a step of pickup of semiconductor chips 10 together with the adhesive film for a semiconductor 2 (FIG. 5).

Figure 1:
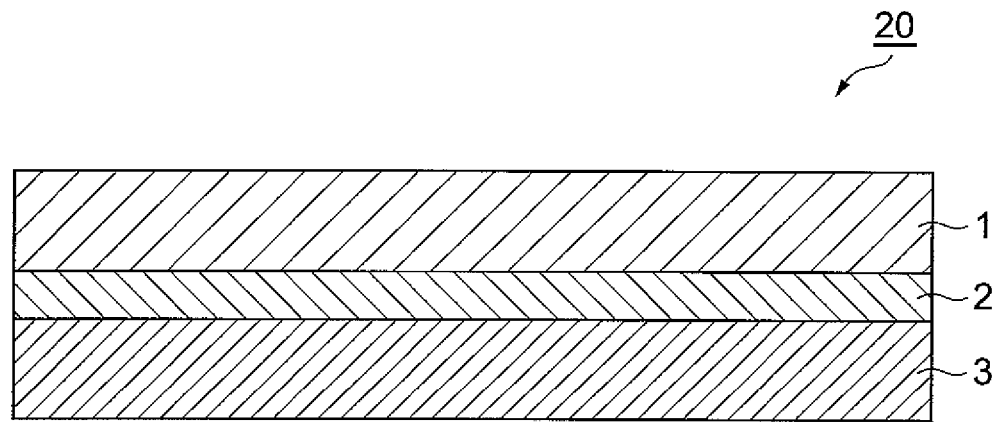
FIG. 1 is an end view showing a method for manufacturing a semiconductor chip according to a first embodiment.

The laminated body 20 in FIG. 1 is prepared by a method in which an adhesive film for a semiconductor 2 and dicing tape 3 are attached in that order on the back side of a semiconductor wafer 1, or a composite sheet obtained by laminating the adhesive film for a semiconductor 2 and dicing tape 3 is attached to the back side of the semiconductor wafer 1 with the adhesive film for a semiconductor 2 facing the semiconductor wafer 1 side.

The semiconductor wafer 1 used is a wafer comprising single-crystal silicon, or polycrystalline silicon, a ceramic, or a compound semiconductor composed of gallium-arsenic. The dicing tape 3 is not particularly restricted so long as it has a sufficient adhesive property to allow anchoring onto an anchoring ring, and can be stretched out so that the adhesive film for a semiconductor 2 is partitioned. Vinyl chloride-based tape, for example, may be used as the dicing tape. The adhesive film for a semiconductor 2 will be described in detail below.

When the adhesive film for a semiconductor 2 or a composite sheet comprising it is attached to the semiconductor wafer 1, the temperature of the adhesive film for a semiconductor is preferably kept at 0-100° C. Attachment of the adhesive film for a semiconductor 2 at such a relatively low temperature will satisfactorily prevent warping of the semiconductor wafer 1 and damage resulting from the thermal history of the dicing tape or backgrind tape. From the same viewpoint, the temperature is more preferably 15° C.-95'C and even more preferably 20° C.-90° C.

Figure 2:
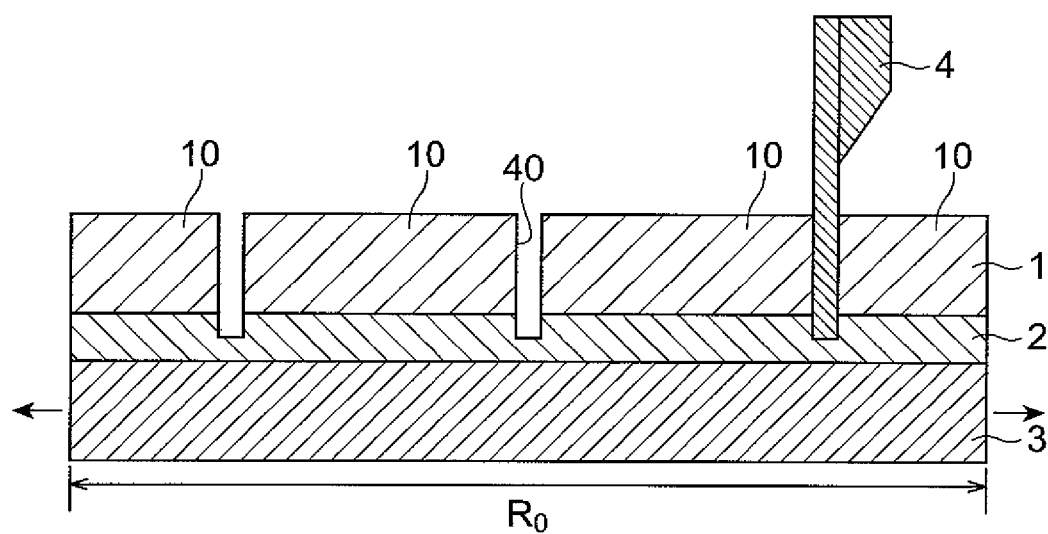
FIG. 2 is an end view showing a method for manufacturing a semiconductor chip according to a first embodiment.

A dicing blade 4 is used to form notches 40 in the laminated body 20 from the semiconductor wafer 1 side, in such a manner that the semiconductor wafer 1 is partitioned into multiple semiconductor chips 10 while leaving a portion uncut in the direction of thickness of the adhesive film for a semiconductor 2 (FIG. 2). In other words, the semiconductor wafer 1 is completely cut while the adhesive film for a semiconductor 2 is half-cut along the lines on which the semiconductor wafer 1 is cut.

FIG. 3 is a magnified end view showing the area near a notch 40 formed in the laminated body 20. "Half-cut" means that the thickness T1 of the adhesive film for a semiconductor 2 and the depth T2 to which the adhesive film for a semiconductor 2 is notched satisfy the relationship T2/T1<1. T2/T1 is preferably 1/5-4/5, more preferably 1/4-3/4 and even more preferably 1/3-2/3. A smaller T2 will tend to prevent generation of burrs when the adhesive film for a semiconductor 2 is partitioned along the notches 40, but will also tend to interfere with complete partitioning of the adhesive film for a semiconductor 2 even by stretching of the dicing tape 3 and increasing the thrusting height during pickup of the semiconductor chip 10. A larger T2 will tend to facilitate complete segmentation of the die bond film even with a low amount of stretching of the dicing tape (also referred to hereunder as "expanding volume"), and even with a low thrusting height during pickup of the semiconductor chip 10. However, an excessively large T2 will tend to reduce the effect against burrs and lower the yield for production of semiconductor devices.

After forming the notches 40, the dicing tape 3 is stretched out in a direction such that the multiple semiconductor chips 10 are separated apart, i.e. in the direction along the main side of the dicing tape 3 (the direction of the arrow in FIG. 2), to partition the adhesive film for a semiconductor 2 (FIG. 4). As a result, the semiconductor chips 10 and the adhesive film-attached semiconductor chips having the adhesive film for a semiconductor 2 attached thereover become arranged on the dicing tape 3.

The expanding volume is the difference between the width (maximum width) of the dicing tape 3 after stretching $R_1$ and the initial width (maximum width) of the dicing tape 3 $R_0$ (see FIG. 2). The expanding volume is preferably 2 mm-10 mm, more preferably 2 mm-8 mm and even more preferably 2 mm-7 mm. Since the notches formed in the adhesive film for a semiconductor 2 as in this embodiment serve as starting points for cutting, the expanding volume may be reduced compared to a situation where the adhesive film for a semiconductor 2 is completely uncut, as in the second embodiment described hereunder.

After the dicing tape 3 has been stretched out, the semiconductor chips 10 are picked up together with the adhesive film for a semiconductor 2 attached onto the back side thereof (FIG. 5). The dicing tape 3 may be pushed up to a prescribed height from the side opposite the semiconductor chips 10, at the locations where the semiconductor chips 10 are to be picked up. The picked-up semiconductor chips 10 are mounted onto supporting members or the like using the adhesive film for a semiconductor 2 attached on their back sides as die bonding materials. The steps after pickup will be described below.

The adhesive film for a semiconductor 2 will now be described in detail.

The adhesive film for a semiconductor 2 has, as a feature, a relatively short tensile breaking elongation. The adhesive film for a semiconductor 2 does not yield in a tensile test, or breaks immediately after yielding at maximum load. With such tensile characteristics, the adhesive film for a semiconductor 2 will be resistant to raising of the ruptured surface when rupture occurs due to tensile stress, so that generation of burrs can be satisfactorily prevented.

More specifically, the tensile breaking elongation of the adhesive film for a semiconductor 2 is preferably less than 5%. The tensile breaking elongation of the adhesive film for a semiconductor 2 is preferably less than 110% with respect to the elongation at maximum load in a tensile test. The adhesive film for a semiconductor 2 with such tensile characteristics can be efficiently and reliably separated with low expanding volume.

With a tensile breaking elongation of 5% or greater, it will be necessary for the expanding volume of the dicing tape 3 to be greater than usual for complete separation of the adhesive film for a semiconductor 2. A proportion of 110% or greater for the tensile breaking elongation with respect to the elongation under maximum load corresponds to a long yield state or proneness to necking, and this will make it difficult to completely separate the adhesive film for a semiconductor 2 while preventing burrs.

From the same viewpoint, the tensile breaking elongation is more preferably less than 4% and even more preferably less than 3.5%. Similarly, the ratio of the tensile breaking elongation to the elongation under maximum load is more preferably less than 108% and even more preferably less than 105%. This ratio is a minimum of 100%, when the tensile breaking elongation and the elongation under maximum load are equal.

The maximum stress, maximum load elongation and tensile breaking elongation are determined by using a test strip with a width of 5 mm, a length of 50 mm and a thickness of 25 μm, cut out from the adhesive film for a semiconductor in the B-stage state, for a tensile test under the following conditions, in an environment at 25° C.

Tensile tester: 100N autograph "AGS-100NH" by Shimadzu
Length between chucks (at start of test): 30 mm
Pull rate: 5 mm/min The maximum load, length between chucks at maximum load and length between chucks at the time of rupture are read from a stress-strain curve obtained by the tensile test, and these values and the measured value for the cross-sectional area of the sample are used to calculate the maximum stress, maximum load elongation and tensile breaking elongation by the following formula.

Maximum stress (Pa)=maximum load (N)/cross-sectional area of sample (m²)

Elongation at maximum load (%)={(length between chucks at maximum load (mm)−30)/30}×100

Tensile breaking elongation (%)={(length between chucks at the time of rupture (mm)−30)/30}×100

Normally, measurement is made for several test pieces, and the average value is recorded as the tensile characteristic of the adhesive film for a semiconductor. From the viewpoint of reproducibility the tensile test is preferably carried out under the conditions described above, but the conditions may be altered to other conditions that give substantially the same test results.

The adhesive film for a semiconductor 2 preferably comprises a thermoplastic resin, a thermosetting component and a filler. By constructing the adhesive film for a semiconductor 2 with these components and appropriately adjusting the types of components and their amounts, it is possible to obtain an adhesive film for a semiconductor 2 having the tensile characteristics specified above.

The thermoplastic resin in the adhesive film for a semiconductor preferably has a glass transition temperature (Tg) of not higher than 60° C. A thermoplastic resin with heat resistance of 300° C. or above is also preferred. As specific examples of preferred thermoplastic resins there may be mentioned polyimide resins, polyamideimide resins, phenoxy resins, acrylic resins, polyamide resins and urethane resins. These may be used alone or in combinations of two or more. Polyimide resins are particularly preferred among those mentioned above. By using a polyimide resin it is possible to easily impart the tensile characteristic described above to the adhesive film for a semiconductor 2 while maintaining a reasonably small filler content.

A thermosetting component is a component that can be hardened when it undergoes crosslinking under heating, and for example, it may be composed of a thermosetting resin and its curing agent. The thermosetting resin may be any known one and is not particularly restricted, but preferred are epoxy resins and imide compounds with at least two thermosetting imide groups in the molecule, from the viewpoint of convenience as a semiconductor peripheral material (availability of high purity product, variety and easily controllable reactivity). An epoxy resin will normally be used together with an epoxy resin curing agent.

An epoxy resin is preferably a compound having two or more epoxy groups. From the viewpoint of curability and cured properties, it is preferably a phenol glycidyl ether-type epoxy resin. As examples of phenol glycidyl ether-type epoxy resins there may be mentioned condensation products of bisphenol A, bisphenol AD, bisphenol S, bisphenol F or halogenated bisphenol A with epichlorohydrin, as well as phenol-novolac resin glycidyl ether, cresol-novolac resin glycidyl ether and bisphenol A-novolac resin glycidyl ether. Novolac-type epoxy resins (glycidyl ethers of cresol-novolac resins, glycidyl ethers of phenol-novolac resins, and the like) are preferred among those mentioned above because they have high cured crosslink density and can increase the adhesive strength of the hot film. They may be used alone or in combinations of two or more.

As examples of epoxy resin curing agents there may be mentioned phenol-based compounds, aliphatic amines, alicyclic amines, aromatic polyamines, polyamides, aliphatic acid anhydrides, alicyclic acid anhydrides, aromatic acid anhydrides, dicyandiamides, organic acid dihydrazides, boron trifluoride amine complexes, imidazoles and tertiary amines. Phenol-based compounds are preferred among these, with phenol-based compounds having two or more phenolic hydroxyl groups being especially preferred. More specifically, naphthol-novolac resins and trisphenol-novolac resins are preferred. Using these phenol-based compounds as epoxy resin curing agents can effectively reduce contamination of the chip surfaces and devices during heating for package assembly, as well as generation of outgas that is a cause of odor.

The filler content may also be adjusted to control the tensile characteristic of the adhesive film for a semiconductor. A high filler content will tend to lower the tensile breaking elongation, while also tending to reduce the ratio of the tensile breaking elongation to the elongation at maximum load. Appropriate use of a filler can produce effects such as improved handleability, increased thermal conductivity, modified melt viscosity and thixotropic properties.

For such purposes, the filler is preferably an inorganic filler. More specifically, preferred inorganic fillers contain one or more inorganic materials selected from the group consisting of aluminum hydroxide, magnesium hydroxide, calcium carbonate, magnesium carbonate, calcium silicate, magnesium silicate, calcium oxide, magnesium oxide, alumina, aluminum nitride, aluminum borate whiskers, boron nitride, crystalline silica, amorphous silica and antimony oxide. Alumina, aluminum nitride, boron nitride, crystalline silica and amorphous silica are preferred for increased thermal conductivity. To adjust the melt viscosity and impart a thixotropic property, aluminum hydroxide, magnesium hydroxide, calcium carbonate, magnesium carbonate, calcium silicate, magnesium silicate, calcium oxide, magnesium oxide, alumina, crystalline silica and amorphous silica are preferred. Alumina, silica, aluminum hydroxide and antimony oxide are preferred for increased humidity resistance. Different types of fillers may also be used in combination.

A high filler content will tend to lower the tensile breaking elongation while raising the elastic modulus and increasing the breaking strength, but will also tend to lower the adhesion, resulting in reduced reflow crack resistance. In particular, it will be more prone to tearing during reflow between semiconductor chips and an adherend with irregularities formed in the surface, such as an organic board. A high filler content will also tend to lower the resistance in reliability testing under high-temperature, high-humidity environments, such as HAST testing. In addition, increasing the filler content will tend to increase the temperature at which the adhesive film for a semiconductor can attach to semiconductor wafers. In consideration of the above, the filler content is preferably less than 30% by mass and more preferably less than 25% by mass with respect to the total mass of the adhesive film for a semiconductor. It is more preferably less than 20% by mass.

The adhesive film for a semiconductor 2 is preferably attachable to a semiconductor wafer as the adherend, at 100° C. or below. The adhesive film for a semiconductor is considered to be attachable to a semiconductor wafer if the peel strength at the interface between the adhesive film for a semiconductor and the semiconductor wafer is at least 20 N/m when the adhesive film for a semiconductor kept at the prescribed temperature is attached to the semiconductor wafer. The adhesive film for a semiconductor may be attached to the semiconductor wafer, for example, using a hot roll laminator set to a temperature of 100° C. or below. The peel strength is measured in an atmosphere at 25° C., with a pull angle of 90° and a pull speed of 50 mm/min. By reducing the filler content or using a thermoplastic resin with a low Tg, for example, it is possible to obtain an adhesive film for a semiconductor that can be attached to a semiconductor wafer at 100° C. or below. The adhesive film for a semiconductor 2 is preferably attachable to the semiconductor wafer at a temperature of not higher than 95° C. and more preferably not higher than 90° C.

The adhesive film for a semiconductor 2 preferably has the heat resistance and humidity resistance required for mounting of a semiconductor chip onto a semiconductor chip mounting supporting member. It should therefore pass a reflow crack resistance test. The reflow crack resistance of the adhesive film for a semiconductor can be evaluated based on the adhesive strength. In order to obtain satisfactory reflow crack resistance, the peel strength is preferably at least 1.0 kg/cm initially, and at least 0.5 kg/cm after standing for 48 hours in an atmosphere at 85° C./85%, when the adhesive film for a semiconductor is attached to a semiconductor wafer with a 4×2 mm square bonding area. The initial peel strength is more preferably at least 1.3 kg/cm and even more preferably 1.5 kg/cm. The peel strength after standing for 48 hours in an atmosphere at 85° C./85% is more preferably at least 0.7 kg/cm and even more preferably at least 0.8 kg/cm.

The adhesive film for a semiconductor 2 may be obtained by a method in which, for example, a coating solution comprising a thermoplastic resin, a thermosetting component, a filler and an organic solvent which dissolves or disperses the foregoing is coated onto a base film, and the organic solvent is removed from the coating solution on the base film by heating.

The organic solvent is not particularly restricted so long as it allows uniform dissolution and dispersion of the materials, and as examples there may be mentioned dimethylformamide, dimethylacetamide, N-methylpyrrolidone, dimethyl sulfoxide, diethyleneglycol dimethyl ether, toluene, benzene, xylene, methyl ethyl ketone, tetrahydrofuran, ethylcellosolve, ethylcellosolve acetate, butylcellosolve, dioxane, cyclohexanone and ethyl acetate. These may be used alone or in combinations of two or more.

The base film is not particularly restricted so long as it can withstand the heating used for removal of the organic solvent. As examples of base films there may be mentioned polyester films, polypropylene films, polyethylene terephthalate films, polyimide films, polyetherimide films, polyether naphthalate films and methylpentene films. A multilayer film comprising two or more of these films may also be used as the base film. The surface of the base film may be treated with a release agent which is silicone-based, silica-based or the like. After removal of the organic solvent, the base film may be used by itself as the support of the adhesive film for a semiconductor without removal.

The adhesive film for a semiconductor may be stored and used as a composite sheet attached to dicing tape. Using such a composite sheet can simplify the semiconductor device production process.

(Second Embodiment)

FIGS. 6, 7, 8 and 9 are end views showing a method for manufacturing a semiconductor chip according to a second embodiment. The method according to this embodiment comprises a step of preparing a laminated body 20 obtained by laminating a semiconductor wafer 1, an adhesive film for a semiconductor 2 and dicing tape 3 in that order (FIGS. 6-8), a step of stretching out the dicing tape 3 in a direction such that the plurality of semiconductor chips 10 separate from each other, to partition the adhesive film for a semiconductor 2 as the semiconductor wafer 1 is partitioned into a plurality of semiconductor chips 10 (FIG. 9), and a step of pickup of the semiconductor chips 10 together with the adhesive film for a semiconductor 2.

Figure 7:
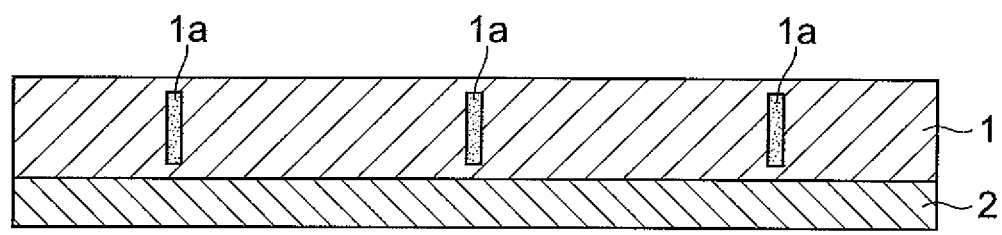
FIG. 7 is an end view showing a method for manufacturing a semiconductor chip according to a second embodiment.
Figure 8:
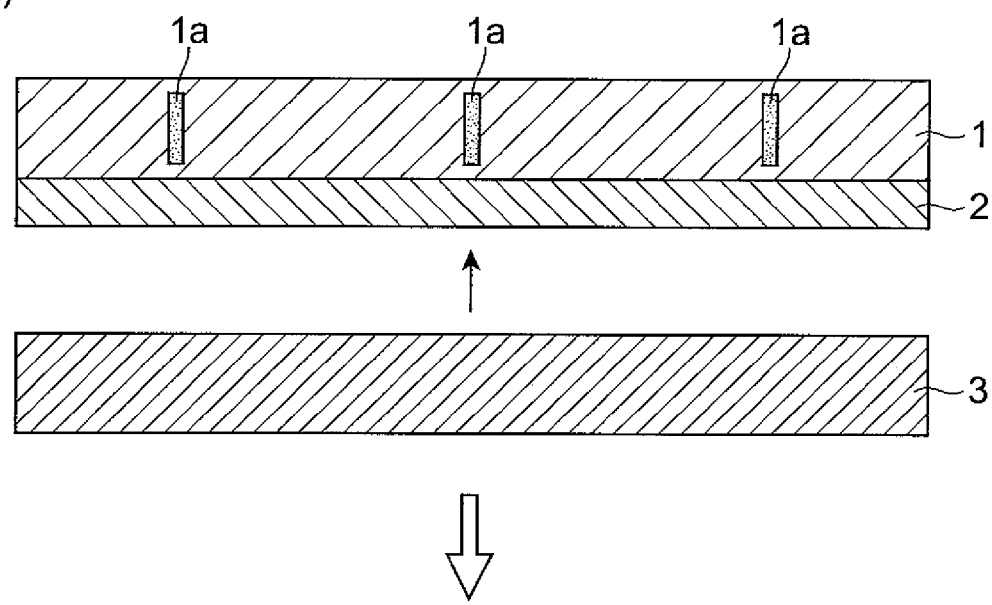
FIG. 8 is an end view showing a method for manufacturing a semiconductor chip according to a second embodiment.
Figure 8:
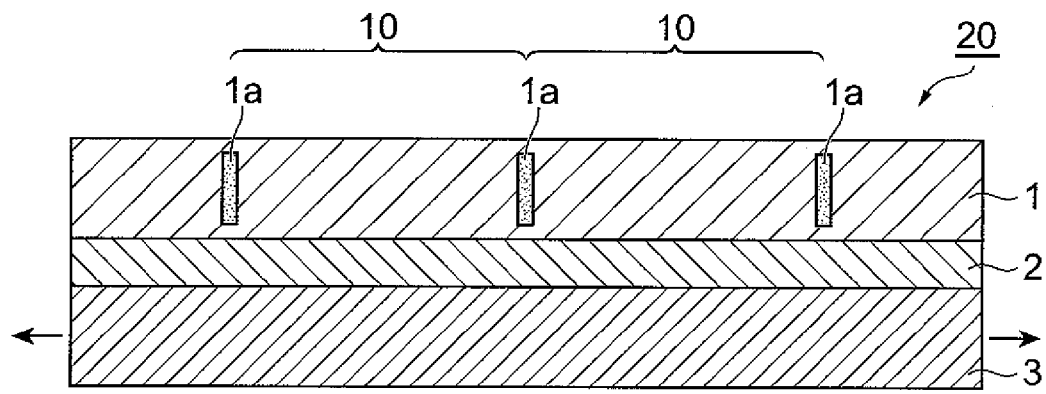

The step of preparing the laminated body 20 comprises a step of laser working to form reformed sections 1a inside the semiconductor wafer 1 along lines 50 that demarcate the semiconductor wafer 1 into multiple semiconductor chips 10 (hereinafter referred to as "division lines") (FIG. 6), a step of attaching an adhesive film for a semiconductor 2 onto the semiconductor wafer 1 in which the reformed sections 1a have been formed (FIG. 7), and a step of attaching dicing tape 3 onto the adhesive film for a semiconductor 2 (FIG. 8).

In the step of forming the reformed sections 1a by laser working, a laser 90 is irradiated along division lines 50 (FIG. 6(b)). The laser working may be carried out under conditions commonly employed for known "stealth dicing" methods. The laser working forms reformed sections 1a inside the semiconductor wafer 1.

Next, the adhesive film for a semiconductor 2 and dicing tape 3 are attached in that order onto the semiconductor wafer 1 as shown in FIGS. 7 and 8, to obtain a laminated body 20.

The steps for obtaining the laminated body 20 are not limited to the order of this embodiment. For example, the reformed sections may be formed by laser working after the adhesive film for a semiconductor has been attached onto the semiconductor wafer.

Figure 9:
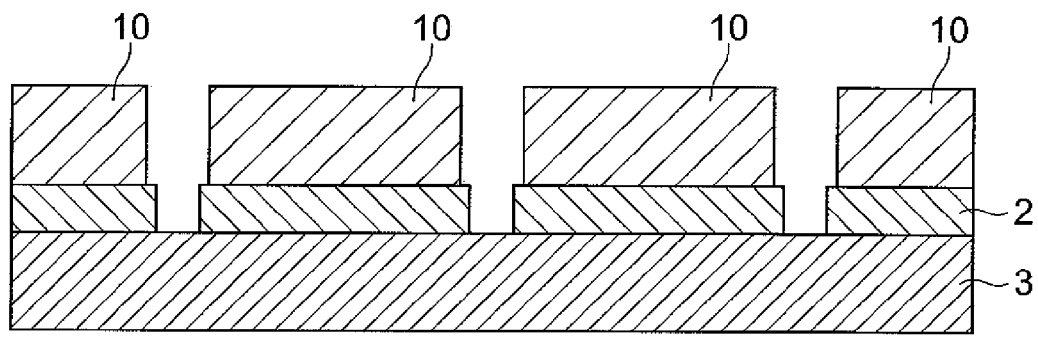
FIG. 9 is an end view showing a method for manufacturing a semiconductor chip according to a second embodiment.

After the laminated body 20 has been obtained, the dicing tape 3 is stretched out in a direction such that the plurality of semiconductor chips 10 separate apart (direction of the arrow in FIG. 8(b)), to partition the semiconductor wafer 1 into multiple semiconductor chips 10 while also partitioning the adhesive film for a semiconductor 2 along the reformed sections 1a (FIG. 9).

According to this embodiment, the semiconductor wafer 1 and adhesive film for a semiconductor 2 are partitioned by stretching the dicing tape, without cutting with a dicing blade. This method does not require simultaneous cutting of the semiconductor wafer 1 and adhesive film for a semiconductor 2 with a dicing blade and can therefore increase the speed of individuation of the semiconductor wafer while inhibiting generation of burrs.

For this embodiment, the expanding volume of the dicing tape 3 is preferably 5-30 mm, more preferably 10-30 mm and even more preferably 10-20 mm. If the expanding volume is less than 5 mm it will tend to be difficult to completely separate the semiconductor wafer 1 and adhesive film for a semiconductor 2, while if it is greater than 30 mm, tearing will tend to occur at sections other than the sections along the division lines.

For this embodiment, the speed at which the dicing tape 3 is stretched out (the expanding speed) is preferably 10-1000 mm/sec, more preferably 10-100 mm/sec and even more preferably 10-50 mm/sec. If the expanding speed is less than 10 mm/sec it will tend to be difficult to completely separate the semiconductor wafer 1 and adhesive film for a semiconductor 2, while if it is greater than 1000 mm/sec, tearing will tend to occur at sections other than the sections along the division lines.

The semiconductor chips 10, that are obtained by the first embodiment or second embodiment as explained above and are picked up together the adhesive film for a semiconductor 2, are used to construct a semiconductor element such as an IC or LSI. For example, the semiconductor chips 10 are bonded onto supporting members via the adhesive film for a semiconductor 2 attached on their back sides. As examples for the supporting members there may be mentioned lead frames such as 42 alloy lead frames and copper lead frames, boards obtained by impregnating a resin film, nonwoven glass fabric or glass woven fabric formed from an epoxy resin, polyimide-based resin, maleimide-based resin or the like with a thermosetting resin such as an epoxy resin, polyimide-based resin or maleimide-based resin and curing the resin, as well as glass boards and ceramic boards of alumina and the like.

Figure 10:
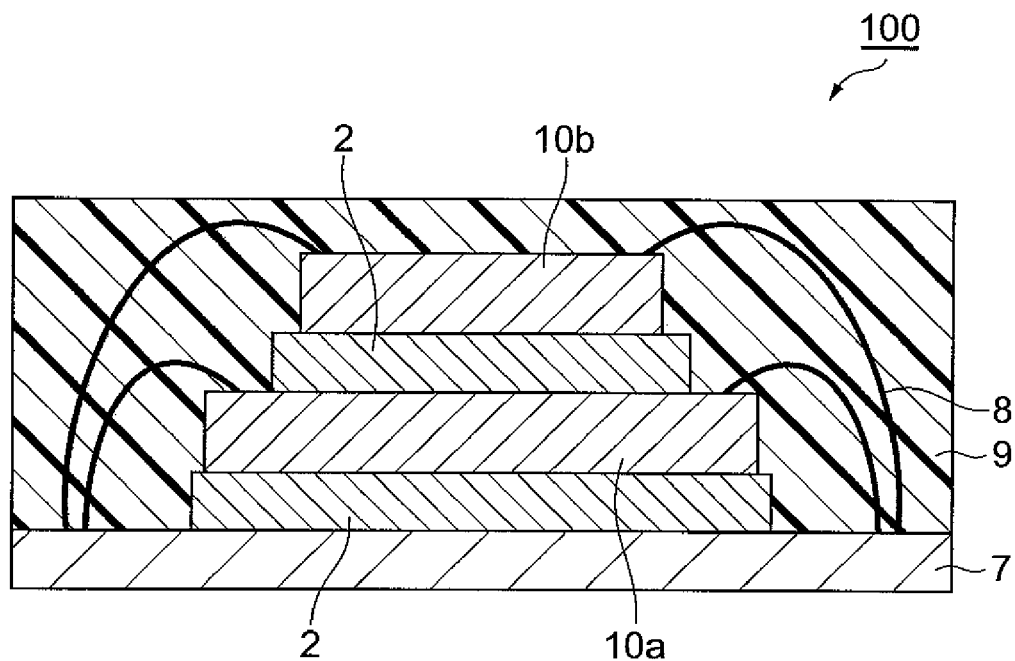
FIG. 10 is a cross-sectional view showing an embodiment of a semiconductor device.

The semiconductor chips may also be bonded together via the adhesive film for a semiconductor. FIG. 10 is a cross-sectional view showing an embodiment of a semiconductor device obtained by such a method. The semiconductor device 100 shown in FIG. 10 comprises a wiring-attached base (supporting member) 7, a semiconductor chip 10a bonded to the wiring-attached base 7 via the adhesive film for a semiconductor 2, and a semiconductor chip 10b bonded to the semiconductor chip 10a via the adhesive film for a semiconductor 2. The semiconductor chips 10a and 10b are connected to the wiring of the wiring-attached base 7 by bonding wire 8. The semiconductor chips 10a and 10b are sealed by a sealing resin layer 9 in which they are embedded.

Bonding between the semiconductor chip and supporting member and between the semiconductor chips is accomplished, for example, by heating at 60-300° C. for 0.1-300 seconds with the adhesive film for a semiconductor sandwiched between the semiconductor chip and supporting member or between the semiconductor chips.

When the adhesive film for a semiconductor 2 contains a thermosetting resin, the bonded semiconductor chips are preferably heated to promote adhesion and curing of the adhesive film for a semiconductor onto the adherend, for increased joint strength. The heating may be appropriately adjusted according to the composition of the adhesive film, and it will normally be 60-220° C. for 0.1-600 minutes. When resin sealing is carried out, the heating in the curing step for the sealing resin may be utilized.

EXAMPLES

The present invention will now be explained in greater detail by examples. However, the present invention is not limited to the examples described below.

1. Formation of Adhesive Films for Semiconductor

Example 1

After placing 1,3-bis(3-aminopropyl)tetramethyldisiloxane (0.1 mol) as a diamine and 150 g of N-methyl-2-pyrrolidone as the solvent in a 500 ml 4-necked flask equipped with a thermometer, stirrer and calcium chloride tube, the mixture was stirred at 60° C. Upon dissolution of the diamine, small portions of 1,10-(decamethylene)bis(trimellitate dianhydride) (0.02 mol) and 4,4'-oxydiphthalic dianhydride (0.08 mol) were added and reaction was conducted at 60° C. for 3 hours. This was followed by heating at 170° C. while blowing in $N_2$ gas, and removal of the water in the system over a period of 3 hours by azeotropic distillation together with part of the solvent. The NMP solution of the polyimide resin obtained by removal of the water was used to form an adhesive film.

To the NMP solution containing the polyimide resin obtained as described above (containing 100 parts by weight of polyimide resin) there were added 4 parts by weight of a cresol-novolac-type epoxy resin (product of Tohto Kasei Co., Ltd.), 2 parts by weight of 4,4'-[1-[4-[1-(4-hydroxyphenyl)-1-methylethyl]phenyl]ethylidene]bisphenol (product of Honshu Chemical Industry) and 0.5 part by weight of tetraphenylphosphoniumtetraphenyl borate (product of Tokyo Chemical Industry Co., Ltd.). There were further added a boron nitride filler (product of Mizushima Ferroalloy Co., Ltd.) at 12 wt % with respect to the total solid weight and AEROSIL filler 8972 (product of Nippon Aerosil Co., Ltd.) at 3 wt % with respect to the total solid weight, and the mixture was thoroughly kneaded to obtain a varnish. The prepared varnish was coated onto a release-treated polyethylene terephthalate film and heated at 80° C. for 30 minutes and then at 120° C. for 30 minutes, after which the polyethylene terephthalate film was peeled off at room temperature (25° C.) to obtain an adhesive film with a thickness of 25 μm.

Example 2

An NMP solution of a polyimide resin was obtained in the same manner as Example 1, except that 1,3-bis(3-aminopropyl)tetramethyldisiloxane (0.06 mol) and 4,9-dioxadecane-1,12-diamine (0.04 mol) were used as diamine components. The obtained NMP solution of the polyimide resin was used to form an adhesive film in the same manner as Example 1.

Example 3

An adhesive film was formed in the same manner as Example 1, except that the boron nitride filler was used at 57 wt %.

Comparative Examples 1-3

There were prepared DF-402 as the adhesive film for Comparative Example 1, DF-470 as the adhesive film for Comparative Example 2 and DF-443 as the adhesive film for Comparative Example 3 (all die bond films by Hitachi Chemical Co., Ltd.).

Comparative Example 4

After placing etherdiamine 2000 (product of BASF) (0.03 mol), 1,12-diaminododecane (0.07 mol) and 150 g of N-methyl-2-pyrrolidone in a 500 ml 4-necked flask equipped with a thermometer, stirrer and calcium chloride tube, the mixture was stirred at 60° C. After dissolution of the diamine, 2,2-bis[4-(3,4-dicarboxyphenoxy)phenyl]propane dianhydride (0.1 mol) was added in small portions. After reaction at 60° C. for 1 hour, it was heated at 170° C. while blowing in $N_2$ gas, and the water was removed by azeotropic distillation together with part of the solvent. The NMP solution of the polyimide resin obtained by removal of the water was used to form an adhesive film. An adhesive film was formed in the same manner as Example 1, except that the obtained solution was used and the boron nitride filler content was 25 wt % with respect to the total solid weight.

Comparative Example 5

An adhesive film was formed in the same manner as Comparative Example 4, except that the boron nitride filler was used at 47 wt %.

2. Evaluation of Adhesive Film (1) Maximum Stress, Maximum Load Elongation and Tensile Breaking Elongation A test strip (width: 5 mm, length: 50 mm) cut out from the adhesive film in the B-stage state was used for a tensile test. The maximum stress, maximum load elongation and tensile breaking elongation were determined from the obtained stress-strain curve, based on the following formulas. The tensile test was conducted using a tensile tester (100N autograph, AGS-100NH by Shimadzu) under conditions with an atmosphere at 25° C., a length between chucks of 30 mm at the start of the test and a pull rate of 5 mm/min.

Maximum stress (Pa)=maximum load (N)/cross-sectional area of sample (m²)

Elongation at maximum load (%)=[(length between chucks at maximum load (mm)−30)/30]×100

Tensile breaking elongation (%)=[(length between chucks at the time of rupture (mm)−30)/30]×100

Figure 11:
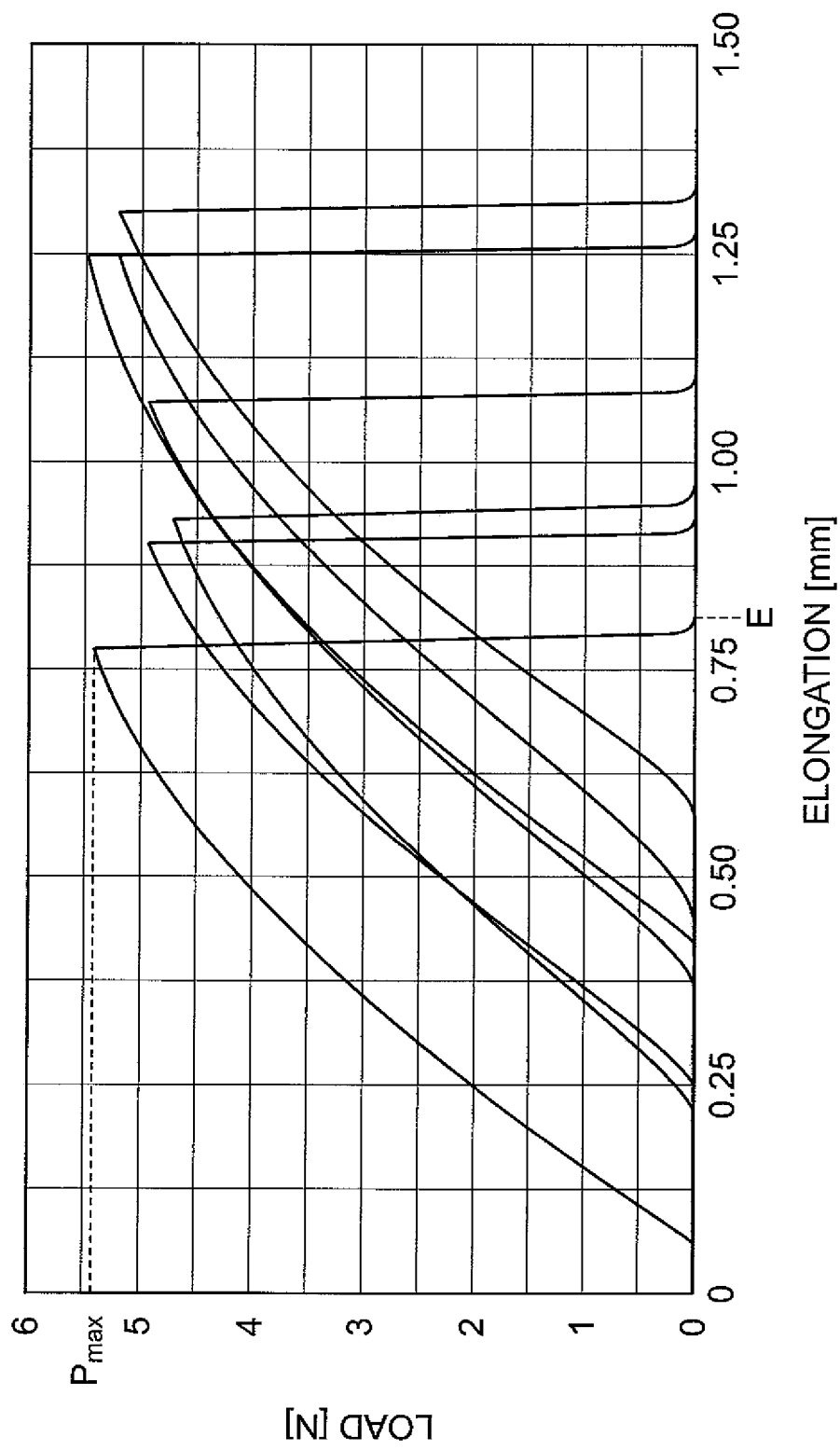
FIG. 11 is a view showing a stress-strain curve for a tensile test of an adhesive film for a semiconductor.
Figure 12:
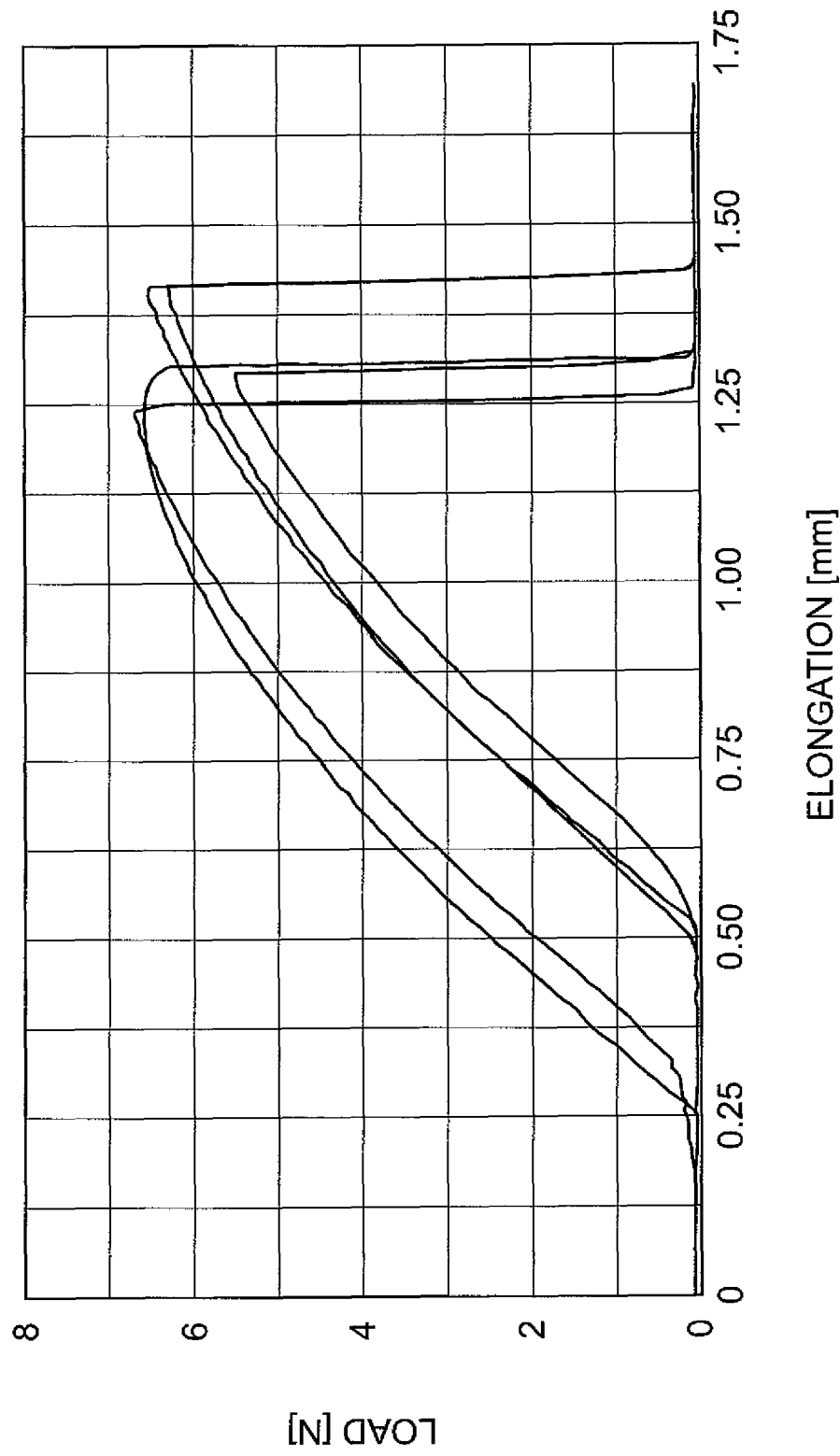
FIG. 12 is a view showing a stress-strain curve for a tensile test of an adhesive film for a semiconductor.
Figure 13:
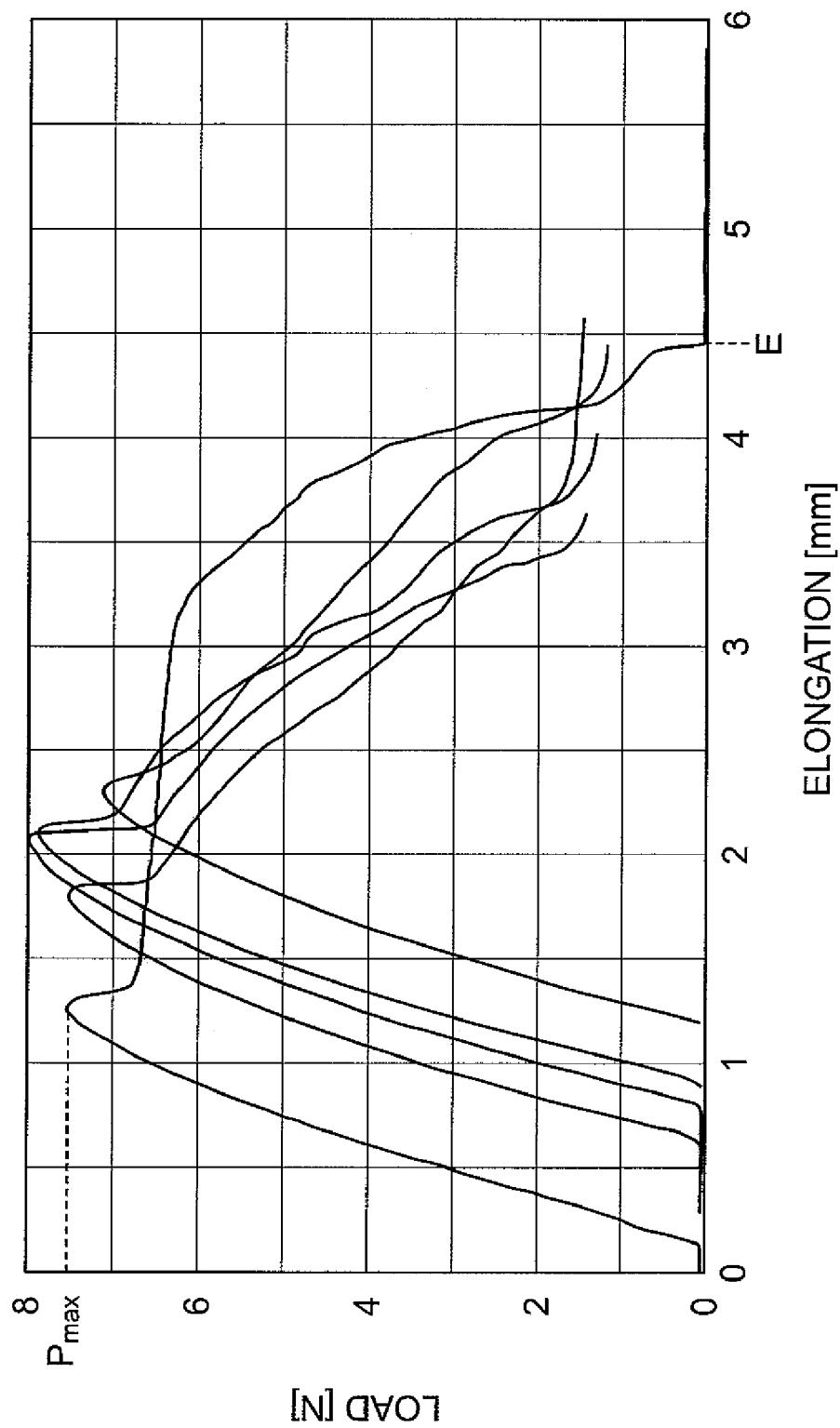
FIG. 13 is a view showing a stress-strain curve for a tensile test of an adhesive film for a semiconductor.

FIG. 11 is a view showing the stress-strain curve for the adhesive film of Example 1, FIG. 12 is the same for Example 2, and FIG. 13 is the same for Comparative Example 1. In the views, elongation (mm)=length between chucks−30. The maximum load elongation is calculated from the elongation corresponding to the maximum load Pmax, and the tensile breaking elongation is calculated from the elongation E at the moment at which the load has fallen to 0, after the test piece has ruptured.

(2) Wafer Attachment Temperature

A peel test was conducted in which a hot roll laminator (0.3 m/min, 0.3 MPa) heated to a prescribed temperature was used to attach an adhesive film with a width of 10 mm to a semiconductor wafer and then the adhesive film was pulled off in a 25° C. atmosphere at a pull angle of 90° and a pull speed of 50 mm/min, to determine the peel strength. The peel test was conducted using a UTM-4-100 TENSILON by Toyo Baldwin. The preset temperature of the hot roll laminator was raised from 40° C., 10° C. at a time, and the lowest temperature among the hot roll laminator temperatures at which peel strength of 20 N/m or greater was obtained was recorded as the wafer attachment temperature.

(3) Peel Strength (Chip Pull-Off Strength)

Figure 14:
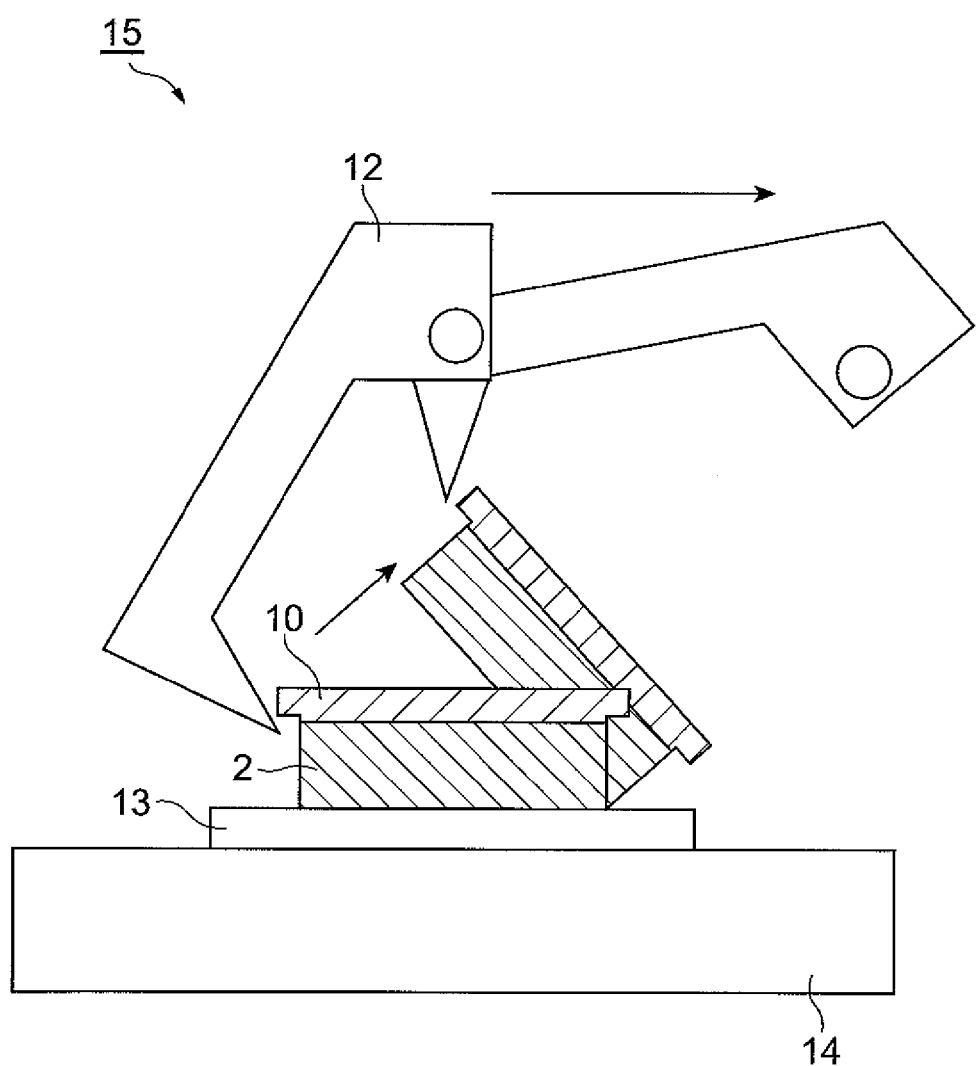
FIG. 14 is a schematic view of a measuring apparatus used for a chip pull off test.

A silicon wafer with a thickness of 400 μm was half-cut from the surface side to a depth of 250 μm and split by force applied in the back-side direction, to prepare 4 mm×2 mm silicon chips having 150 μm-wide raised edges on the perimeter. An adhesive film cut out to a size of 4 mm×2 mm was sandwiched between the silicon chips and 42 alloy lead frame. A load of 200 gf was applied to the entire section and contact bonded therewith at 160° C. for 5 seconds, and then heated at 180° C. for 60 minutes for postcuring of the adhesive film. The chip pull-off strength during heating at 260° C. for 20 seconds was then measured using the measuring apparatus 15 shown in FIG. 14 with a modified push-pull gauge. The measuring apparatus 15 comprised a heating plate 14, a die pad 13 mounted on the heating plate 14, and a push-pull gauge 12. The sample was placed on the die pad 13 of the measuring apparatus 15, and the push-pull gauge 12 was hooked onto the raised edge of the silicon chip to measure the chip peel strength. The peel strength of each sample was measured initially, and after high-temperature, high-humidity treatment for 48 hours in an environment of 85° C., 85% RH. This measurement allows the surface adhesive strength of the adhesive film to be measured. A higher numerical value corresponds to greater resistance to reflow crack formation.

(4) Reflow Crack Resistance

An adhesive film-attached silicon chip comprising a silicon chip cut to a 5 mm square and an adhesive film attached thereto was bonded to a circuit board having wiring formed on the surface of a polyimide film (25 μm thickness) as the base. A separate 5 mm-square adhesive film-attached silicon chip was then bonded to this silicon chip.

Treatment of ten obtained samples was carried out twice, the treatment comprising passing each sample through an IR reflow furnace set so that the surface temperature reached 260° C. and the temperature was held for 20 seconds, and then allowing it to stand at room temperature (25° C.) for cooling. Cracks in the treated samples were observed visually and with an acoustic microscope, to confirm the presence of any board/chip or chip/chip cracks. The reflow crack resistance was evaluated on the following scale, based on the observation results.

A: No cracks found in any of the samples.
C: Cracks occurred in one or more samples.

TABLE 1

|  |  | Units | Ex. 1 | Ex. 2 | Ex. 3 | Comp. Ex. 1 | Comp. Ex. 2 | Comp. Ex. 3 | Comp. Ex. 4 | Comp. Ex. 5 |
|---|---|---|---|---|---|---|---|---|---|---|
| Filler content |  | wt % | 15 | 15 | 60 | 9 | 10 | 40 | 28 | 50 |
| Film thickness |  | μm | 25 | 25 | 25 | 25 | 25 | 25 | 25 | 25 |
| Wafer attachment temperature |  | ° C. | 90 | 80 | 150 | 140 | 120 | 160 | 40 | 140 |
| Tensile properties | Maximum stress | MPa | 42.7 | 45.9 | 22.6 | 60.0 | 54.0 | 23.2 | 0.7 | 5.0 |
|  | Maximum load elongation | % | 2.9 | 2.5 | 2.3 | 3.9 | 3.9 | 12.2 | 306.2 | 185.0 |
|  | Tensile breaking elongation | % | 3.0 | 2.5 | 2.4 | 10.3 | 14.4 | 13.0 | 311.6 | 201.0 |
|  | Tensile breaking elongation/Maximum load elongation | % | 104 | 101 | 104 | 264 | 370 | 106 | 102 | 108 |
| Chip pull-off strength | Initial | kg/ 4 × 2 mm | 1.7 | 1.7 | 0.5 | 2.0 | 2.0 | 1.1 | 1.6 | 1.3 |
|  | After 85° C./85%/48 h |  | 1.2 | 1.1 | 0.2 | 1.4 | 1.5 | 0.6 | 1.0 | 0.7 |
| Reflow crack resistance | Board/chip | — | A | A | C | A | A | C | A | C |
|  | Chip/chip | — | A | A | C | A | A | A | A | A |

(5) Tear Resistance, Chip Cracks and Burrs

Each of the adhesive films produced in the examples and comparative examples described above was attached onto a semiconductor wafer, and the semiconductor wafer was partitioned into semiconductor chips by methods of "full-cutting", "half-cutting" or "laser dicing" described hereunder, after which the tear resistance of the adhesive film and occurrence of chip cracks and burrs were confirmed. Vinyl chloride-based tape (90 μm thickness) was used as the dicing tape for all of the methods.

Full-Cutting

A hot roll laminator (DM-300H by JCM, 0.3 m/min, 0.3 MPa) was used to attach each adhesive film to a 50 μm-thick semiconductor wafer at the wafer attachment temperature listed in Table 1. Next, dicing tape was laminated onto the adhesive film under conditions with a hot plate temperature of 80° C., to prepare a dicing sample. A stainless steel ring was attached around the perimeter of the dicing tape, and a DFD-6361 by DISCO was used to cut the dicing sample. The cutting was performed with a single-cut system in which working is completed with a single blade, under conditions with an NBC-ZH104F-SE 27BDBB blade, a blade rotation rate of 45,000 rpm and a cutting speed of 50 mm/s. The blade height (cutting depth) during cutting was 80 as a height allowing complete cutting of the adhesive film. Next, the dicing tape was stretched out with an expanding apparatus, with the ring in an anchored state. The expanding speed was 10 mm/s and the expanding volume was 3 mm.

Half-Cutting

A test was conducted under the same conditions as full-cutting, except that the blade height (cutting depth) was 100 μm, as a height leaving a 10 μm-thick section of the die bond film uncut.

chip opposite the adhesive film was classified according to the scale shown below to evaluate the condition of chip cracking.
AA: <5 μm
A: ≧5 μm and <10 μm
B: ≧10 and <25 μm
C: ≧25 μm Burrs After stretching out the dicing tape, the semiconductor chips were picked up together with the adhesive film. The edges of the adhesive film-attached semiconductor chips that had been picked up were observed with an optical microscope to confirm the condition of burrs.
AA: Burr lengths of <20 μm
A: Burr lengths of ≧20 μm and <40 μm
B: Burr lengths of ≧40 and <100 μm
C: Burr lengths of ≧100 μm

TABLE 2

| | | Units | Ex. 1 | Ex. 2 | Ex. 3 | Comp. Ex. 1 | Comp. Ex. 2 | Comp. Ex. 3 | Comp. Ex. 4 | Comp. Ex. 5 |
|---|---|---|---|---|---|---|---|---|---|---|
| Full-cutting | Expanding volume | mm | 3 | 3 | 3 | 3 | 3 | 3 | 3 | 3 |
| | Chip cracks | — | B | B | B | B | B | B | C | C |
| | Burrs | — | B | B | B | B | B | B | C | C |
| Half-cutting | Expanding volume | mm | 3 | 3 | 3 | 3 | 3 | 3 | 3 | 3 |
| | Tear resistance | — | AA | AA | AA | C | C | A | C | C |
| | Chip cracks | — | A | A | A | — | — | A | — | — |
| | Burrs | — | AA | AA | AA | — | — | AA | — | — |
| Laser dicing | Expanding volume | mm | 15 | 15 | 15 | 15 | 15 | 15 | 15 | 15 |
| | Tear resistance | — | AA | AA | AA | C | C | C | C | C |
| | Chip cracks | — | AA | AA | AA | — | — | — | — | — |
| | Burrs | — | AA | AA | AA | — | — | — | — | — |

Laser Dicing

The semiconductor wafer (50 μm thickness) was subjected to laser irradiation to form reformed sections therein along the lines demarcating the semiconductor chips. Adhesive film and dicing tape were then attached in that order, by the same procedure as for full-cutting, and a stainless steel ring was attached around the outer periphery of the dicing tape. Next, the dicing tape was stretched out with an expanding apparatus, with the ring in an anchored state. The expanding speed was 30 mm/s and the expanding volume was 15 mm.

Tear resistance

After stretching out the dicing tape, the presence of any tearing of the adhesive film served with an optical microscope, the length of the completely cleaved section as a proportion of the total length of the cut surface was determined, and the proportion was classified according to the scale shown below to evaluate the tear resistance. The tear resistance was not evaluated for full-cutting, since the adhesive film was cut with a dicing blade.
AA: ≧98%
A: ≧90%
B: ≧50% and <90%
C: <50%

Chip Cracking

After stretching out the dicing tape, the condition of chip cracking was observed with an optical microscope. The length of chip cracks formed on the side of the semiconductor The adhesive films of the examples, which had tensile breaking elongations of less than 5% and tensile breaking elongation/elongation at maximum load ratios of less than 110%, exhibited satisfactory tear resistance with both half-cutting and laser dicing, while the generation of chip cracks and burrs was also sufficiently minimized. The adhesive films of Examples 1 and 2 which had filler contents of less than 30% by mass were attachable to semiconductor wafers at 100° C. or below, and were highly superior in terms of reflow crack resistance.

In contrast, the adhesive films of the comparative examples, which had tensile breaking elongations of 5% or greater or tensile breaking elongation/elongation at maximum load ratios of 110% or greater, did not always exhibit sufficient tear resistance and did not allow manufacturing of semiconductor chips at high yield. Comparative Example 3 exhibited relatively high tear resistance with half-cutting, but the tear resistance with laser dicing was inadequate.

The invention claimed is:

1. A method for manufacturing a semiconductor chip comprising the steps of:
    preparing a laminated body having a semiconductor wafer, an adhesive film for a semiconductor and a dicing tape laminated in that order, the adhesive film for a semiconductor having a tensile breaking elongation of less than 5%, the tensile breaking elongation being less than 110% of an elongation at maximum load, the semiconductor wafer being partitioned into multiple semiconductor chips and notches being formed from the semiconductor wafer side so that at least a portion of the adhesive film for a semiconductor remains uncut in its thickness direction, and stretching out the dicing tape in a direction so that the multiple semiconductor chips are separated apart, to separate the adhesive film for a semiconductor along the notches.

2. The manufacturing method according to claim 1, wherein the adhesive film for a semiconductor comprises a thermoplastic resin, a thermosetting component and a filler, a filler content being less than 30% by mass with respect to the mass of the adhesive film for a semiconductor.

3. The manufacturing method according to claim 1, wherein the step of preparing the laminated body includes a step of attaching the adhesive film for a semiconductor onto the semiconductor wafer at a temperature of not higher than 100° C.

4. The manufacturing method according to claim 1, wherein the notches are formed in the semiconductor wafer and the adhesive film for a semiconductor.

5. A method for manufacturing a semiconductor chip comprising the steps of:

preparing a laminated body having a semiconductor wafer, an adhesive film for a semiconductor and a dicing tape laminated in that order, the adhesive film for a semiconductor having a tensile breaking elongation of less than 5% and the tensile breaking elongation being less than 110% of an elongation at maximum load, with reformed sections formed in the semiconductor wafer by laser working along lines for division of the semiconductor wafer into multiple semiconductor chips, and stretching out the dicing tape in a direction so that the multiple semiconductor chips are separated apart, to partition the semiconductor wafer into multiple semiconductor chips while partitioning the adhesive film for a semiconductor along the reformed sections.

6. The manufacturing method according to claim 5, wherein the adhesive film for a semiconductor comprises a thermoplastic resin, a thermosetting component and a filler, a filler content being less than 30% by mass with respect to the mass of the adhesive film for a semiconductor.

7. The manufacturing method according to claim 5, wherein the step of preparing the laminated body includes a step of attaching the adhesive film for a semiconductor onto the semiconductor wafer at a temperature of not higher than 100° C.

* * * * *